United States Patent
Anderson

(10) Patent No.: US 7,079,296 B2
(45) Date of Patent: Jul. 18, 2006

(54) INTEGRATED READING AND WRITING OF A HOLOGRAM WITH A ROTATED REFERENCE BEAM POLARIZATION

(75) Inventor: Kenneth E. Anderson, Boulder, CO (US)

(73) Assignee: InPhase Technologies, Inc., Longmont, CO (US)

( * ) Notice: Subject to any disclaimer, the term of this patent is extended or adjusted under 35 U.S.C. 154(b) by 0 days.

(21) Appl. No.: 11/215,959

(22) Filed: Aug. 30, 2005

(65) Prior Publication Data

US 2006/0050342 A1    Mar. 9, 2006

Related U.S. Application Data

(62) Division of application No. 10/075,840, filed on Feb. 13, 2002, now Pat. No. 6,956,681.

(60) Provisional application No. 60/310,153, filed on Aug. 3, 2001.

(51) Int. Cl.
*G03H 1/04* (2006.01)
(52) U.S. Cl. .......................... 359/35; 365/216
(58) Field of Classification Search ................ 359/1, 359/35; 365/125, 216, 234
See application file for complete search history.

(56) References Cited

U.S. PATENT DOCUMENTS

2004/0029038 A1* 2/2004 Minabe et al. ........... 430/270.1

FOREIGN PATENT DOCUMENTS

JP          2000-268380       * 9/2000

OTHER PUBLICATIONS

J.H.Hong and R.Saxena, "Diffraction efficiency of volume holograms written by coupled beams", Optics Letters, 16(3), pp. 180-182(1991).*

* cited by examiner

*Primary Examiner*—Leonidas Boutsikaris
(74) *Attorney, Agent, or Firm*—Morrison & Foerster LLP

(57) ABSTRACT

A method for monitoring diffraction while reading a hologram includes: illuminating a holographic medium with a reference beam to generate a data beam for a hologram that has been recorded at a set diffraction efficiency with a first polarization, the reference beam having a second polarization; and measuring an offset component in an output arm of the data beam.

22 Claims, 2 Drawing Sheets

US 7,079,296 B2

INTEGRATED READING AND WRITING OF A HOLOGRAM WITH A ROTATED REFERENCE BEAM POLARIZATION

CROSS-REFERENCE TO RELATED APPLICATIONS

This application is a divisional of application Ser. No. 10/075,840, filed Feb. 13, 2002, now U.S. Pat. No. 6,956,681 which claims the benefit of provisional application No. 60/310,153, filed Aug. 3, 2001. Each of these application is incorporated herein by reference in its entirety.

TECHNICAL FIELD

The present invention relates to data storage generally and more particularly to holographic data storage.

BACKGROUND ART

The material dynamics of recording holograms in a holographic medium varies significantly as a function of the number of holograms stored in a single location and also as a function of how many times that location has been read before it has been permanently fixed. Typically, a scheduling technique is used to account for this dynamic effect with the amount of exposure necessary so that all of the recorded holograms within the same location have the same diffraction efficiency, thereby maximizing the storage potential of that location.

In general, a scheduling algorithm is a predetermined exposure sequence based on the material sensitivity and dynamics that dictates how long each hologram should be exposed during the recording process so that every hologram within the same location has equal diffraction efficiency upon readout. The recording process includes simultaneous illumination of a location in a holographic medium by a data beam and a reference beam. A probe beam that is nominally a duplicate of the reference beam that was used for the recording can be used at any time to read the hologram and measure the efficiency of the recording. However, the process of reading the hologram with the probe beam further exposes the material and therefore decreases the sensitivity of the material similarly as in the recording process. Separately using a probe beam in this way therefore decreases the number of holograms that can be written in the corresponding location, which is an undesirable effect.

Reading out a hologram requires that the probe beam be Bragg matched to the hologram. This can lead to a significant amount of alignment difficulty if the probe beam is generated by a source that is separate from the reference beam or if the probe beam has a wavelength different from the reference. Since the diffracted reference-beam has identical phase and amplitude characteristics to the data beam, it cannot be easily separated from the data beam and detected to monitor the holographic writing process unless the data beam is turned off. However, repeatedly turning off the data beam for diagnostic purposes, undesirably interrupts the recording operation.

Therefore, there is a need for monitoring the process of recording a hologram without interfering with the recording process and without creating additional operational difficulties.

SUMMARY OF THE INVENTION

A method according to the present invention for monitoring diffraction while recording a hologram includes: generating a source beam; generating a data beam by projecting a first component of the source beam through a data source, the data beam having a first polarization; generating a reference beam by adjusting a polarization of a second component of the source beam to provide a second polarization; recording a hologram in a holographic medium from an interference between the data beam and the reference beam; and measuring an offset component in an output arm of the data beam.

The method may further include: determining an output power from the offset component; determining an input power corresponding to an input arm of the reference beam; and determining an estimated output power from the set diffraction efficiency and the input power. The output power from the offset component may be monitored to determine a positioning condition for reading the hologram based on the estimated output power. This positioning condition may, for example, result in adjusting the reference beam (e.g., in position or orientation) or the holographic medium (e.g., in position or orientation).

The method may further include determining an output power from the offset component. The output power from the offset component may be monitored to determine a stability condition for recording the hologram.

The act of measuring the offset component in the output arm of the data beam may include: splitting the offset component from the output arm of the data beam to form an offset beam; and detecting the offset beam.

The act of generating the data beam may include adjusting a polarization of the first component of the source beam to provide the first polarization. Then the polarizations of the data beam and the reference beams may differ from the polarization of the source beam.

The second polarization may differ from the first polarization by a small rotation. The second polarization then has a correspondingly small component that can be used for the monitoring the recording process rather than for carrying out the recording.

The present invention enables the monitoring of the sensitivity of a holographic medium during the recording process. Additionally the present invention enables diagnostic monitoring when reading a hologram that has been stored at a prescribed diffraction efficiency.

A method according to the present invention for monitoring diffraction while reading a hologram includes: illuminating a holographic medium with a reference beam to generate a data beam for a hologram that has been recorded at a set diffraction efficiency with a first polarization, the reference beam having a second polarization; and measuring an offset component in an output arm of the data beam.

The method may further include: determining an output power from the offset component; determining an input power corresponding to an input arm of the reference beam; and determining a diffraction efficiency from the output power and the input power. The diffraction efficiency may be monitored to determine a validation condition for reading the hologram based on the set diffraction efficiency.

The method may further include: determining an output power from the offset component; determining an input power corresponding to an input arm of the reference beam; and determining an estimated output power from the set diffraction efficiency and the input power. The output power from the offset component may be monitored to determine a positioning condition for reading the hologram based on the estimated output power. This positioning condition may, for example, result in adjusting the reference beam (e.g., in position or orientation) or the holographic medium (e.g., in position or orientation).

The method may further include: determining an output power from the offset component; determining an input power corresponding to an input arm of the reference beam; and determining an estimated output power from the set diffraction efficiency and the input power. The output power from the offset component may be monitored to determine a hologram type that corresponds to the set diffraction efficiency (e.g., an alignment hologram). Then for example a corresponding adjustment (e.g., an alignment) may be carried out. According to the present invention, non-information-bearing holograms may be prerecorded into the medium for alignment and other calibration purposes (e.g., calibrating input/output power levels). Preferably these non-information-bearing holograms are recorded at known diffraction efficiencies that are different from those of the information-bearing holograms.

The act of measuring the offset component in the output arm of the data beam may include: splitting the offset component from the output arm of the data beam to form an offset beam; and detecting the offset beam.

The second polarization may differ from the first polarization by a small rotation. The second polarization then has a correspondingly small component that can be used for the monitoring the reading process rather than for carrying out the recording.

DETAILED DESCRIPTION OF EXEMPLARY EMBODIMENTS

Figure 1:
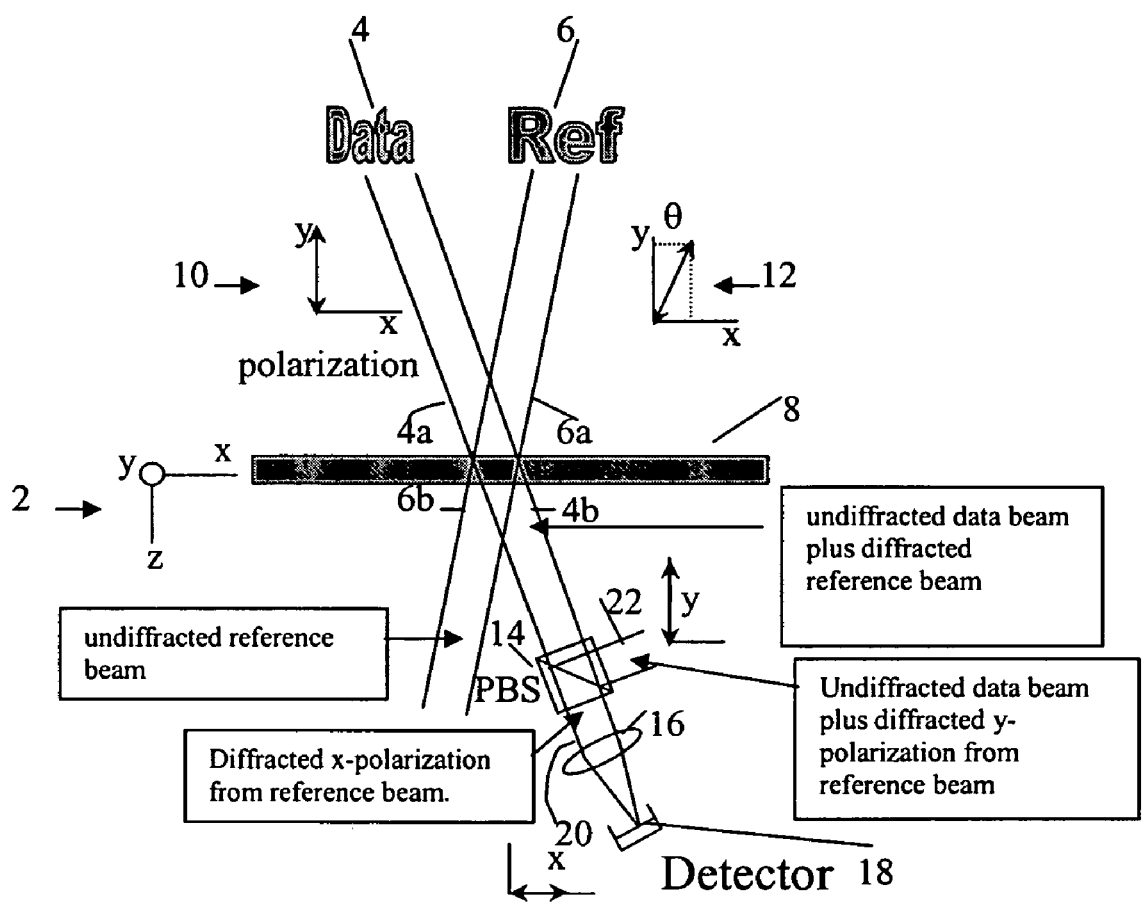
FIG. 1 shows an embodiment of the present invention for integrated reading and writing of a hologram.

A embodiment of a integrated system for reading and writing a hologram according to the present invention is shown in FIG. 1. A right-hand coordinate system 2 is shown with the x axis and the z axis in the plane of the page and the y axis emerging from the page. A data beam 4 and a reference beam 6 are shown intersecting in a holographic medium 8 where a hologram is stored. Corresponding to the path of the data beam 4 on either side of the holographic medium 8, FIG. 1 shows an input arm 4a and an output arm 4b of the data path. Similarly FIG. 1 shows an input arm 6a and an output arm 6b of the reference path.

A polarization representation 10 shows that the propagating electric field of the data beam 4 in the input arm 4a of the data path has a polarization that is aligned with the y axis (i.e., a vertical polarization). Similarly, a polarization representation 12 shows that the propagating electric field of the reference beam 6 in the input arm 6a of the reference path has a polarization that is can be characterized as a rotation of the y axis by an amount θ in the x-y plane. Preferably θ is taken as a small value as described below. Then the reference beam 6 correspondingly has a small component of its polarization in the x-direction (i.e., a horizontal polarization), which is orthogonal to the polarization of the data beam 4.

Figure 2:
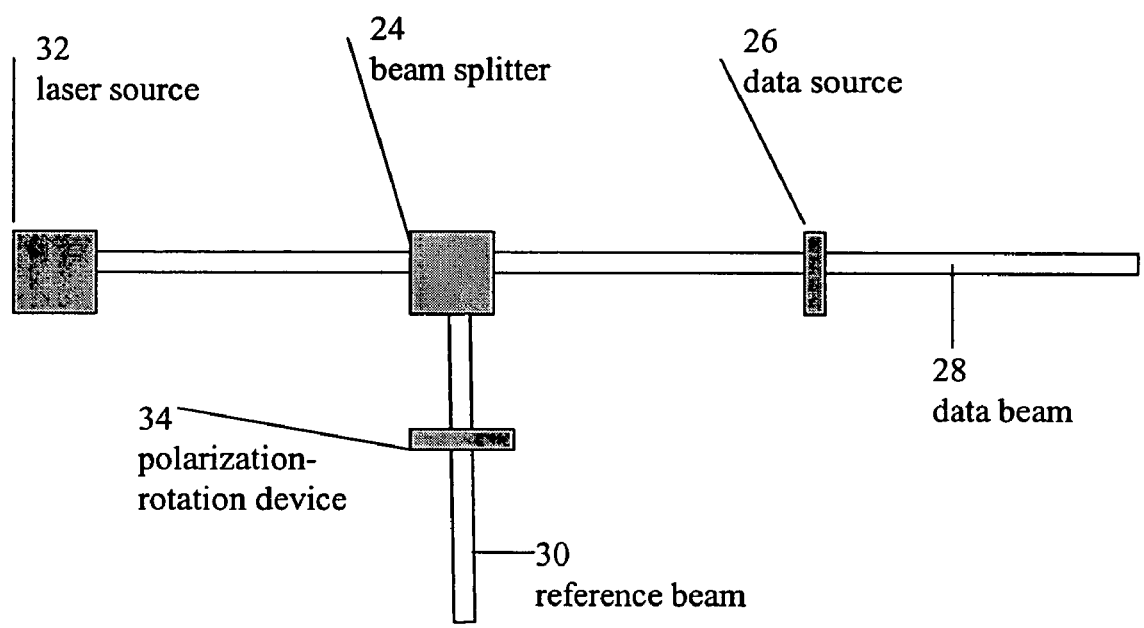
FIG. 2 shows a system for generating a reference beam and a data beam for the embodiment shown in FIG. 1.

The data beam 4 and the reference beam 6 can be generated by standard methods as illustrated in FIG. 2. A laser source 32 generates a laser that is split at a beam splitter 24 into two components. A first component passes though a data source 26 (e.g., a spatial light modulator) to form a data beam 28. A second component forms a reference beam 30 with a polarization that is rotated (e.g., by angle θ) at a polarization-rotation device 34 (e.g., a half-wave plate).

In FIG. 1 the horizontal polarization component in the reference beam 6 will not contribute to the writing process in the holographic medium 8, but, assuming the material is isotropic, will diffract off the grating that is written by the vertical components of the data 4 and reference beams 6. A polarizing beam splitter (PBS) 14 placed in an output arm of the data path after the holographic medium 8 is used to reflect the field that has vertical polarization. The unreflected beam continues on to a lens 16 that focuses the light onto a detector 18. Since the data beam 4 is vertically polarized, the horizontally polarized light that is diffracted from the reference beam 6 can be easily separated from the data beam using the PBS 14.

That is, the data beam's output arm 4b includes a component from the undiffracted data beam 4 plus a component from the diffracted reference beam 6. The PBS 14 separates the data beam's output arm into a component with horizontal polarization 20 that is read at the detector 18 and a complementary component with vertical polarization 22.

The component with horizontal polarization 20, which is measured at the detector 18, results from the diffracted reference beam 6. Since the data beam 4 is vertically polarized, it will reflect off the PBS 14 and not contribute significantly to the detector level 18. However, even in the event that there is a small amount of horizontal polarization in the data beam 4, this will contribute as a DC offset of the overall signal at the detector 18. However, this effect can be compensated since the average intensity of the data beam 4 is approximately constant over every hologram and is known a priori and can therefore be subtracted out. By choosing a moderately small value for θ (e.g., 1–5 degrees in some configurations), the process can be tuned so that readings in the detector 18 from the horizontal polarization of the diffracted reference beam are substantially above the level of any DC bias at the detector 18. Furthermore, most of the energy in the reference beam 6 has a vertical polarization and thereby contributes to the writing of the hologram. The choice of θ is then made as a tradeoff between the use of power for writing the hologram and the use of power for reading the hologram for diagnostic purposes.

Before the hologram is written, there will be no horizontal polarization component diffracted into the data path from the reference beam and the signal will therefore be at a minimum at the detector. The diffracted signal intensity will vary with the strength of the written hologram at a given time according to the material recording dynamics and thereby produce a direct mechanism by which the hologram strength can be monitored both while recording and while reading the hologram. The amount of reference beam power that falls onto the detector is proportional to the strength of the hologram and this can be used as a real-time measurement of the hologram strength. The strength of the written hologram may be characterized by a diffraction efficiency that measures the amount of energy that is diffracted by the hologram. For example, one can define:

$$e = \frac{P_{diffracted}}{P_{input}} \quad (1)$$

where the diffraction efficiency e is defined as a ratio of a diffracted power $P_{diffracted}$ to an input power $P_{input}$, where $P_{input}$ measures an input power that can be diffracted and $P_{diffracted}$ measures the actual power diffracted.

For the embodiment shown in FIG. 1, the diffracted power $P_{diffracted}$ may be calculated from readings at the detector 18. In general, it not necessary to directly measure the input power $P_{input}$ to calculate the diffraction efficiency e as long as $P_{input}$ remains relatively constant during the recording process and the relationship between e and $P_{diffracted}$ was determined at a previous time (e.g., during device calibration). Then the diffracted power $P_{diffracted}$ will be proportional to the diffraction efficiency e where proportionality constant is given by $P_{input}$. Alternatively, $P_{input}$ may be determined from a direct measurement (e.g., at the laser source 32).

The present invention enables real-time exposure scheduling while recording a hologram. This is especially useful if, for example, the hologram has been exposed to read-out beams before the entire stack of holograms has been written and therefore sequential write-hologram locations might have significant variations in recording dynamics. Measurements taken at the detector 18 can be used as feedback for dynamically adjusting the amount of exposure necessary to achieve the desired diffraction efficiency of the current hologram being recorded in the holographic medium 8. The diffracted reference-beam power (assuming it is aligned correctly) is proportional to the diffraction efficiency of the recorded hologram since it is directly reading the grating as it is built up. As the hologram is recorded, the diffraction efficiency increases according to some predetermined material-dependent scaling relationship. Once the recorded hologram diffracts the desired amount of power, the recording can be stopped. This could replace the need for the system to follow a predetermined exposure schedule since the exposure is dynamically altered on an "as needed"basis, For example, for a nominal value of Pinput, =10–1 W, an initial reading at the detector 18 may give a value of Pdiffracted=10–5 W, which corresponds to diffraction efficiency of e=10–4 (0.01%). The recording maybe stopped for example when the diffraction efficiency reaches a threshold value of e=10–3 (0.1%). In this way estimating the diffraction efficiency e allows one to monitor and manage the dynamic range of the holographic medium 8.

The present invention enables vibration detection while recording a hologram. The reference beam can be used to detect sudden changes in diffracted power due to a misalignment caused by vibration. Any movement in the system tat causes significant misalignment will alter the amount of power that is diffracted from the reference beam horizontal component into the data path. This will appear as fluctuations at the detector that can be monitored and used to determine the hologram integrity. This can also be used in to monitor vibration during the read mode of the device so that the system can have some rough determination of whether the vibration is affecting data integrity.

When reading a hologram that has been recorded at a set diffraction efficiency, the present invention enables fine-tuned control as well as diagnostic monitoring. Under these circumstance only the reference beam 6 (which is also denoted as the probe beam when reading holograms) is turned on Then in FIG. 1 the input arm 6a of the reference path is active since the reference beam 6 is on, but the input arm 4a of the datapath is not active. On the output side, the output arm 4b of the data path is active because the hologram recorded in the holographic medium 8 diffracts the reference beam 6, but the output arm 6b of the reference path is not active. Then diffraction efficiency e can be characterized as above in terms of a diffracted power $P_{diffracted}$, which can be measured or characterized at the detector 18, an input power $P_{input}$, which can be measured from or characterized by the reference beam 6 (or its source).

The present invention enables fine servo positioning (e.g., locking onto the hologram and/or stack) while reading a hologram. Once a hologram has be written into the material at a set diffraction efficiency, diffracted power resulting from the reference beam horizontal polarization component and this hologram can be used as a metric by which misalignments can be measured. A very fine positional and/or angular alignment on the reference beam to the hologram can be achieved by servo-feedback from the detector 18 in FIG. 1 to the fine positioning device so that the position of maximum diffracted power can be found. The image detector can then be read out with some assurance that the maximum signal has been obtained.

The present invention also enables probing of alignment holograms that have been recorded with some set diffraction efficiency. If known alignment holograms are pre-recorded into the material at a fixed interval, they can be used to ensure that the position of the reference beam is well calibrated at particular locations. For example, if a stack geometry is used, the first hologram of each stack can be an alignment hologram. This would ensure R and θ positional accuracy of the medium with respect to the reference beam before any read or write hologram is attempted. An alignment hologram could also be incorporated into the stack at particular intervals (e.g., first and last holograms) to ensure the accuracy of the alignment within the stack as well.

Another potential use of alignment holograms for servo control can be utilized by writing alignment holograms that have a diffracted power output that is different (preferably smaller to minimize the effect on the material) than that of recorded data holograms. Since the data holograms are optimized to have approximately 50% ON pixels and 50% OFF pixels, these will all have approximately the same diffracted output power after they have been written. Writing an alignment hologram with 25% ON pixels will result in a detector level half of that from the holographic data pages. This difference can be used to differentiate an alignment page from a data page. This technique can also provide a method of calibrating the expected power levels of the diffracted beam. Since the diffraction efficiency (and therefore diffracted power) of the alignment holograms can be very accurately recorded, these holograms can act as a power calibration for servo control and any other techniques that can benefit from an accurate determination of output power levels. The first two alignment holograms in a stack, for example, can be engineered with a 17% (17% ON pixels) and 33% diffraction power respectively. At a later time, the diffracted power of these holograms gives a direct measure of the laser power and any other deviations that might have occurred in the device that could lead to smaller diffracted powers.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A method for monitoring diffraction while reading a hologram, comprising:

illuminating a holographic medium with a reference beam to generate a data beam for a hologram that has been recorded at a set diffraction efficiency with a first polarization, the reference beam having a second polarization, and measuring an offset component in an output arm of the data beam.

2. A method as claimed in claim 1, Thither comprising:
determining an output power from the offset component;
determining an input power corresponding to an input arm of the reference beam; and
determining a diffraction efficiency from the output power and the input power.

3. A method as claimed in claim 2, further comprising: monitoring the diffraction efficiency to determine a validation condition for reading the hologram based on the set diffraction efficiency.

4. A method as claimed in claim 1, Thither comprising:
determining an output power from the offset component;
determining an input power corresponding to an input arm of the reference beam;
determining an estimated output power from the set diffraction efficiency and the input power; and
monitoring the output power from the offset component to determine a positioning condition for reading the hologram based on the estimated output power.

5. A method as claimed in 4, further comprising:
adjusting the reference beam based on the positioning condition.

6. A method as claimed in claim 4, further comprising:
adjusting the holographic medium based on the positioning condition.

7. A method as claimed in claim 1, fritter comprising:
determining an output power from the offset component;
determining an input power corresponding to an input arm of the reference beam;
determining an estimated output power from the set diffraction efficiency and the input power; and
monitoring the output power from the offset component to determine a hologram type based on the estimated output power.

8. A method as claimed in 7, further comprising:
calibrating the input power based on the hologram type.

9. A method as claimed in 7, further comprising:
calibrating the output power based on the hologram type.

10. A method as claimed in clam 1, wherein measuring the offset component in the output arm of the data bean includes:
splitting the offset component from the output arm of the data beam to form an offset beam; and
detecting the offset bean.

11. A method as claimed in claim 1, wherein the second polarization differs from the first polarization by a small rotation.

12. An apparatus for reading a hologram, comprising:
a holographic medium including a hologram that has been recorded at a set diffraction efficiency with a first polarization,
reference-beam source for illuminating the holographic medium with a reference beam to generate a data beam corresponding to the hologram, the reference beam having a second polarization;
a polarizing beam splitter for separating an offset component from an output arm of the data beam; and
a detector for measuring the offset component.

13. An apparatus as claimed in 12, further comprising a monitoring unit for:
determining an output power from the offset component;
determining an input power corresponding to an input arm of the reference beam; and
determining a diffraction efficiency from the output power and the input power.

14. An apparatus as claimed in 13, wherein the monitoring unit further includes operations for monitoring the diffraction efficiency to determine a validation condition for reading the hologram based on the set diffraction efficiency.

15. An apparatus as claimed in 12, further comprising a monitoring unit for:
determining an output power from the offset component;
determining an input power corresponding to an input arm of the reference beam;
determining an estimated output power from the set diffraction efficiency and the input power; and
monitoring the output power from the offset component to determine a positioning condition fur reading the hologram based on to estimated output power.

16. An apparatus as claimed in 15, further comprising: an adjustment unit for adjusting the reference beam based on the positioning condition.

17. An apparatus as claimed in 15, further comprising: an adjustment unit for adjusting the holographic medium based on the positioning condition.

18. An apparatus as claimed in 12, further comprising a monitoring unit for:
determining an output power from the offset component;
determining an input power corresponding to an input arm of the reference beam;
determining an estimated output power from the set diffraction efficiency and the input power; and
monitoring the output power from the offset component to determine a hologram type based on the estimated output power.

19. An apparatus as claimed in claim 18, further comprising: an adjustment unit for adjusting an input power of the reference beam based on the output power of the offset component and the hologram type.

20. An apparatus as claimed in 12, further comprising:
a lens for focusing the offset component onto the detector.

21. An apparatus as claimed in 12, wherein the second polarization differs from the first polarization by a small rotation.

22. A method as claimed in claim 1, wherein measuring the offset component includes:
splitting the offset component from the output arm of the data beam to form an offset beam; and
focusing the offset beam onto a detector.

* * * * *